United States Patent
Ato et al.

(10) Patent No.: US 7,621,457 B2
(45) Date of Patent: Nov. 24, 2009

(54) READER / WRITER AND METHOD FOR MANUFACTURING THE SAME

(75) Inventors: Koji Ato, Nagano (JP); Tomoki Kobayashi, Nagano (JP); Toshiji Shimada, Nagano (JP)

(73) Assignee: Shinko Electric Industries Co., Ltd., Nagano (JP)

( * ) Notice: Subject to any disclaimer, the term of this patent is extended or adjusted under 35 U.S.C. 154(b) by 247 days.

(21) Appl. No.: 11/333,000

(22) Filed: Jan. 17, 2006

(65) Prior Publication Data

US 2006/0157568 A1  Jul. 20, 2006

(30) Foreign Application Priority Data

Jan. 17, 2005  (JP)  ............................. 2005-009467

(51) Int. Cl.
*G06K 19/06* (2006.01)
*G06K 7/08* (2006.01)

(52) U.S. Cl. ...................................... 235/492; 235/451

(58) Field of Classification Search ................. 235/492, 235/451; 257/690, 679, 494; 343/873; 428/413
See application file for complete search history.

(56) References Cited

U.S. PATENT DOCUMENTS

| | | | | |
|---|---|---|---|---|
| 4,350,654 A | * | 9/1982 | Yoshida | 264/129 |
| 5,598,032 A | * | 1/1997 | Fidalgo | 235/492 |
| 5,852,289 A | * | 12/1998 | Masahiko | 235/492 |
| 6,373,447 B1 | * | 4/2002 | Rostoker et al. | 257/491 |
| 6,538,210 B2 | * | 3/2003 | Sugaya et al. | 174/258 |
| 6,568,600 B1 | * | 5/2003 | Carpier et al. | 235/492 |
| 7,180,169 B2 | * | 2/2007 | Ishimaru et al. | 257/690 |
| 7,240,847 B2 | * | 7/2007 | Puschner et al. | 235/492 |
| 2005/0003199 A1 | * | 1/2005 | Takaya et al. | 428/413 |
| 2005/0011960 A1 | * | 1/2005 | Koike et al. | 235/492 |
| 2005/0024290 A1 | * | 2/2005 | Aisenbrey | 343/873 |
| 2005/0045369 A1 | * | 3/2005 | Ishimaru et al. | 174/250 |

FOREIGN PATENT DOCUMENTS

| EP | 977145 A2 | * | 2/2000 |
|---|---|---|---|
| JP | 2004 118440 | | 4/2004 |
| JP | 2004 166175 | | 6/2004 |

* cited by examiner

*Primary Examiner*—Thien Minh Le
*Assistant Examiner*—Thien T Mai
(74) *Attorney, Agent, or Firm*—Ladas & Parry LLP

(57) ABSTRACT

A reader/writer includes a substrate, a communication control part on the substrate, a molded resin layer sealing the communication control part and an antenna connected to the communication control part. The antenna is provided on the molded resin layer.

2 Claims, 8 Drawing Sheets

10D

READER / WRITER AND METHOD FOR MANUFACTURING THE SAME

BACKGROUND OF THE INVENTION

1. Field of the Invention

The present invention generally relates to a communication device enabling data transmission and reception without contacting, and more specifically, a reader/writer performing communications without contacting an IC (Integrated Circuit) tag.

2. Description of the Related Art

In recent years, the RFID (Radio Frequency Identification) system has become popular, which system is characterized by reading and writing data in an IC card containing an IC chip therein without contacting the IC card. In such an RFID system, an IC card (or called IC tag) and an RFID reader/writer (or called only reader/writer) are used. The RFID reader/writer reads and writes data in the IC card.

Since such an RFID reader/writer performing data transmission and reception with the IC card is configured to perform data communication by utilizing an antenna thereof, the RFID reader/writer is characterized by enabling data transmission and reception without contacting. Accordingly, as for an antenna structure, various forms are suggested. (For example, see the Patent Documents 1 and 2)

[Patent Document 1]
Japanese Patent Publication No. 2004-118440

[Patent Document 2]
Japanese Patent Publication No. 2004-166175

However, when establishing an RFID system, it is necessary to connect an antenna. Accordingly, it is difficult to reduce the size and thickness of the RFID system. For example, as for a communication device such as an RFID reader/writer, it is necessary to connect an antenna. Thus, it is difficult to reduce a size of the reader/writer. Further, it is necessary to provide wirings for connecting the antenna. As a result, the structure of the reader/writer becomes complicated.

SUMMARY OF THE INVENTION

It is a general object of the present invention to provide a reader/writer that substantially obviates one or more problems caused by the limitations and disadvantages of the related art.

It is another and more specific object of the present invention to provide a reader/writer in which size and thickness thereof are reduced, performing communications with an IC card.

To achieve these and other advantages in accordance with the purpose of the invention, an embodiment of the invention provides a reader/writer including a substrate, a communication control part on the substrate, a molded resin layer sealing the communication control part, and an antenna connected to the communication control part. The antenna is provided on the molded resin layer.

Accordingly, it is possible to provide a reader/writer enabling reducing the size and thickness thereof.

According to at least one of the embodiments of the present invention, a method is provided for manufacturing a reader/writer including a substrate, a communication control part provided on the substrate, a molded resin layer for sealing the communication control part, and an antenna connected to the communication control part. The method includes the steps of forming the communication control part and the antenna connecting post on the substrate, which antenna connecting post is provided for connecting the communication control part and the antenna; forming the molded resin layer on the substrate so as to cover the communication control part and the antenna connecting post; grinding the molded resin layer so as to expose the antenna connecting post, and forming the antenna on the molded resin layer. The antenna is connected to the antenna connecting post which is exposed in the grinding step.

Accordingly, it is possible to provide a reader/writer with reduced size and thickness thereof.

The method further includes a step of forming the insulating layer so as to cover the antenna. Accordingly, it is possible to protect the antenna.

According to another aspect of the present invention, a method is provided for manufacturing a reader/writer including a substrate, a communication control part provided on the substrate, a molded resin layer sealing the communication control part, and an antenna connected to the communication control part. The method includes the steps of forming the communication control part on the substrate, forming the molded resin layer on the substrate so as to cover the communication control part, forming a via hole penetrating the molded resin layer, forming an antenna connecting post in the via hole, which antenna connecting post is provided for connecting the communication control part and the antenna, and forming the antenna on the molded resin layer. The antenna is connected to the antenna connecting post.

Accordingly, it is possible to provide a reader/writer with reduced size and thickness thereof.

The method further includes a step of forming the insulating layer so as to cover the antenna. Accordingly, it is possible to protect the antenna.

Therefore, it is possible to provide a reader/writer performing communications with an IC card, in which the size and thickness of the reader/writer are reduced.

BRIEF DESCRIPTION OF THE DRAWINGS

Other objects and further features of the present invention will become apparent from the following detailed description when read in conjunction with the accompanying drawings, in which.

DESCRIPTION OF THE PREFERRED EMBODIMENTS

In the following, embodiments of the present invention are described with reference to the accompanying drawings.

First Embodiment

Figure 1A:
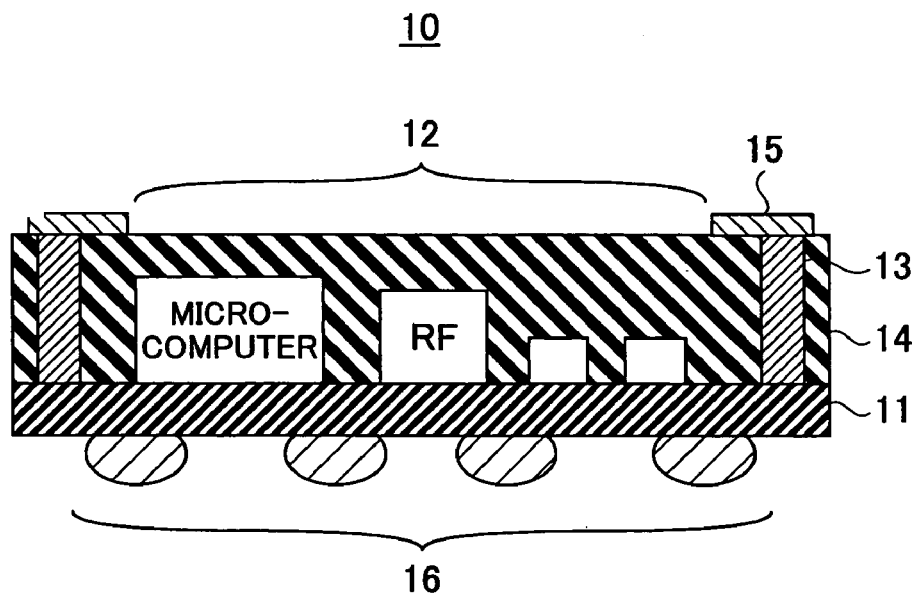
FIG. 1A is a cross-sectional pattern view illustrating a reader/writer according to a first embodiment of the present invention.

FIG. 1A is a cross-sectional view illustrating a reader/writer 10 according to a first embodiment of the present invention. The reader/writer according to the present embodiment can read and write data in an IC card containing an IC chip therein without making contact. The reader/writer 10 comprises an antenna 15 for transmitting and receiving data when reading and writing the data in the IC card, and a communication control part 12 connected to the antenna 15. The communication control part 12 performs data communication control. The communication control part 12 includes, for example, a chip such as an IC (microcomputer), an RF part, a chip capacitor, a chip resistor and the like.

The communication control part 12 is formed on the substrate 11 made from, for example, a resin member. A molded resin layer 14 is formed on the substrate 11 so as to cover the communication control part 12.

In the reader/writer according to the present embodiment, the antenna 15 is formed on the molded resin layer 14. Accordingly, the size and thickness of the reader/writer can be reduced greater than, for example, the conventional reader/writer utilizing an antenna which is separately connected.

Moreover, the antenna 15 is configured to be connected to the communication control part 12 via an antenna connecting post 13 formed standing on the substrate 11 and penetrating the molded resin layer 14. Furthermore, the antenna connecting post 13 is connected to the communication control part 12 via, for example, wirings (drawing is omitted) formed on the substrate 11. Accordingly, it is possible to connect the communication control part 12 formed on the substrate 11 and the antenna 15 by a simple structure.

The antenna connecting post 13 can be formed by, for example, a plating method of Cu or a pasting of Cu. However, the methods and the materials are not limited to them. In addition, the antenna 15 can be formed by a plating method of Cu, a printing method, a spattering method, a CVD method and the like. However, the methods and the materials are not limited to them.

A detailed description is given of these manufacturing methods below.

On a surface of the substrate 11, reverse to the surface where the communication control part 12 is formed, for example, plural solder bumps are provided for connecting the communication control part 12. The communication control part 12 may be connected to, for example, a board or other devices via the solder bumps 16. The solder bumps 16 and the antenna 15 are formed so as to oppose each other across the molded resin layer 14.

Figure 1B:
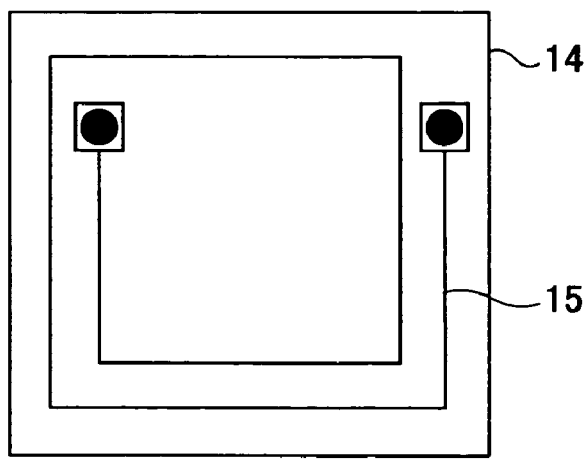
FIG. 1B is a plan view illustrating the reader/writer of FIG. 1A.

FIG. 1B is a plan view of the reader/writer 10. It should be noted that the above described components are given the same reference numerals, and a description thereof is omitted.

Referring to FIG. 1B, the antenna 15 patterned after a loop is formed on the molded resin layer 14. The antenna 15 is connected to the antenna connecting post 13 penetrating the molded resin layer 14. Further, the pattern formed on the antenna 15 is not limited to the shape shown in FIG. 1B, but various shapes can be formed as the pattern.

Figure 2:
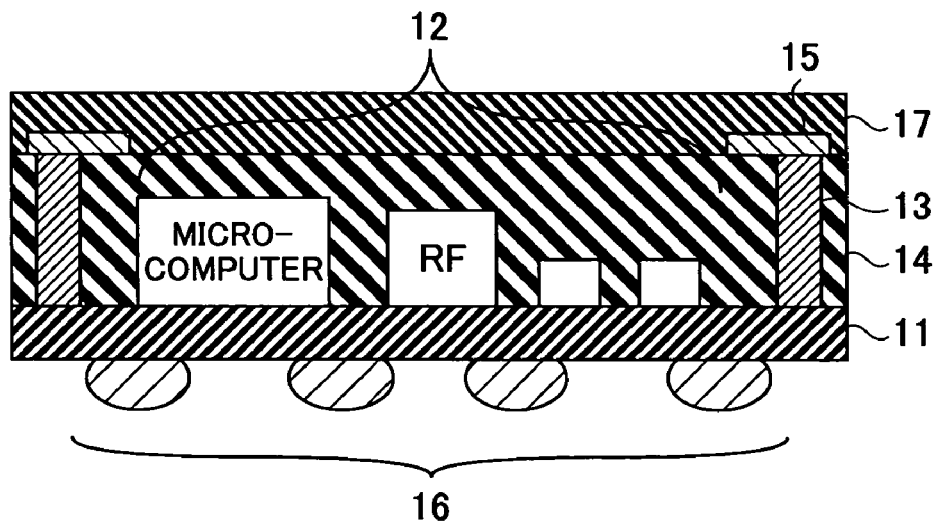
FIG. 2 is a modified example of the reader/writer of FIG. 1A.

Moreover, the reader/writer as shown above can be modified as a reader/writer 10A shown in FIG. 2.

FIG. 2 is a cross-sectional pattern view illustrating the reader/writer 10A which is a modified example of the reader/writer 10 shown in FIG. 1A.

It should be noted that the above described components are given the same reference numerals, and a description thereof is omitted.

Referring to FIG. 2, in the reader/writer 10A as shown in FIG. 2, an insulating layer 17 is formed on the molded resin layer 14 and the antenna 15 so as to cover the antenna 15. The antenna 15 is configured to be protected by the insulating layer 17. In this case, the insulating layer 17 may be formed from, for example, molded resin which is the same material as the molded resin layer 14. Further, other resin materials and other insulating materials can also be used.

Next, a description is given of a method for manufacturing the readers/writers 10 and 10A in turn in reference to FIGS. 3A through 3E.

Figure 3A:
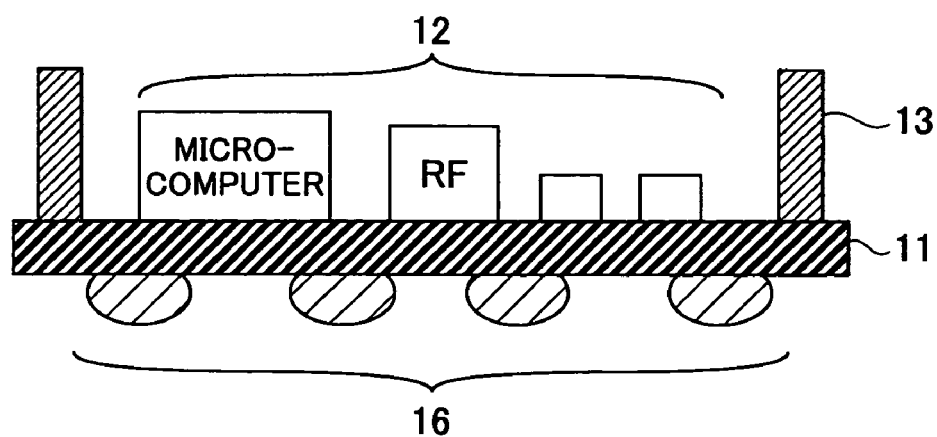
FIGS. 3A through 3E are views illustrating a manufacturing method of the reader/writer according to the first embodiment of the present invention.

First, in the process shown in FIG. 3A, the communication control part 12 is formed by providing, for example, a chip such as an IC (microcomputer), an RF part, a chip capacitor, a chip resistor and the like on the substrate 11 made from, for example, a resin member. Then, an antenna connecting post 13 made from, for example, Cu, having substantially, for example, a columnar shape is formed on the substrate 11. In this case, wirings can be formed on the substrate 11 in advance for connecting the communication control part 12 and the antenna connecting post 13. Further, the wirings can be formed after these components are provided. The wirings are provided for connecting the communication control part 12 and the antenna connecting post 13. Moreover, on the substrate 11, solder bumps 16 are formed connected to the communication control part 12. The solder bumps 16 may be formed after a molded resin layer 14 is formed, which is described below.

Figure 3B:
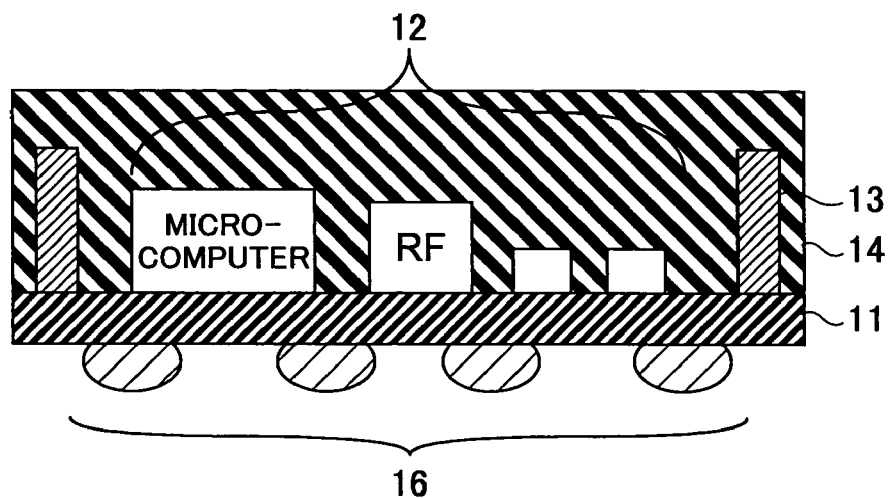

Next, in the process shown in FIG. 3B, the molded resin layer 14 made from, for example, molded resin is formed on the communication control part 12, the antenna connecting post 13, and the substrate 11 so as to cover the communication control part 12 and the antenna connecting post 13. If necessary, the molded resin layer 14 is hardened.

Figure 3C:
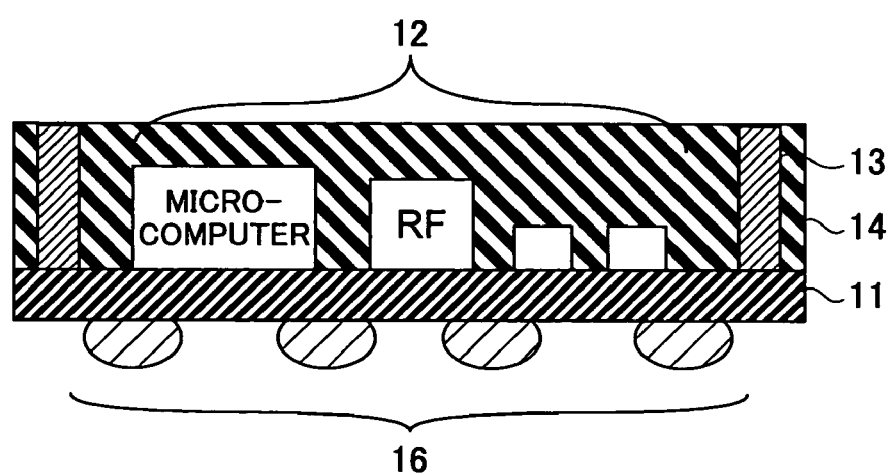

Then, in the process shown in FIG. 3C, an upper surface of the mold resin layer 14, i.e., a surface reverse to a surface contacting the substrate 11, is ground by, for example, buffing, CMP (Chemical Mechanical Polishing), and the like so that the antenna connecting post 13 is exposed. In this case, the antenna connecting post 13 may also be ground.

Figure 3D:
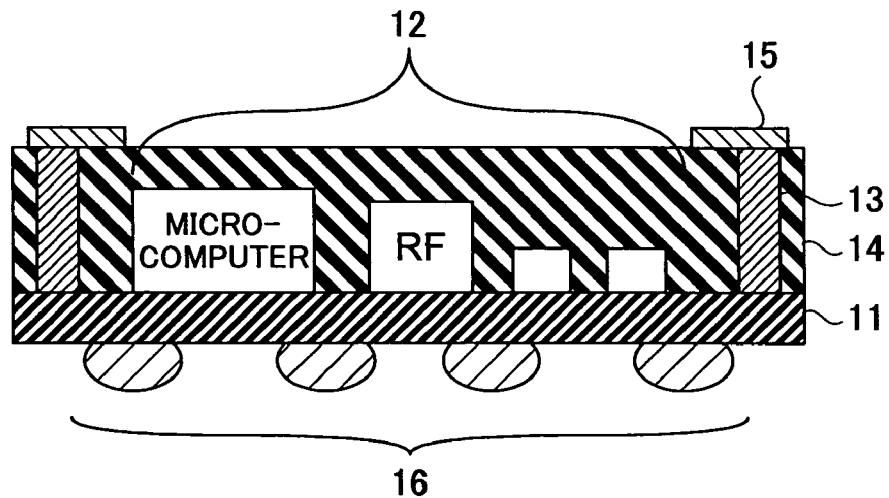

Next, in the process shown in FIG. 3D, the antenna 15 connected to the antenna connecting post 13 is formed on the molded resin layer 14 after the surface thereof is polished. In this case, the antenna 15 can be formed according to, for example, a plating method of Cu, a printing method, a spattering method, a CVD method and the like. However, the present invention is not limited to the methods and the materials. For example, the antenna 15 can be made from Al, Au, Ag, Ni, Ti and alloys thereof.

Figure 3E:
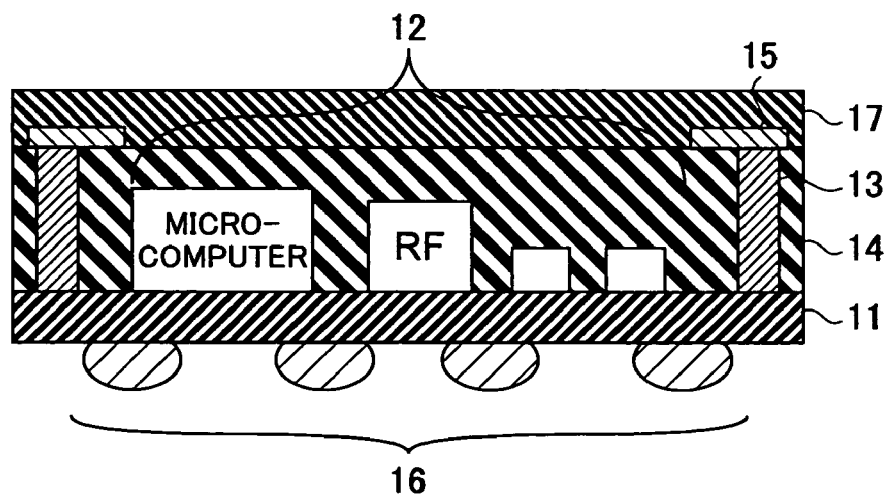

Further, in the process shown in FIG. 3E, if necessary, an insulating layer 17 can be formed on the molded resin layer 14 and the antenna 15 so as to cover the antenna 15. In this case, the insulating layer 17 can be made from, for example, molded resin which is the same material as the molded resin layer 14. Moreover, resin materials other than molded resin, or other insulating materials can be used.

Second Embodiment

Figure 4A:
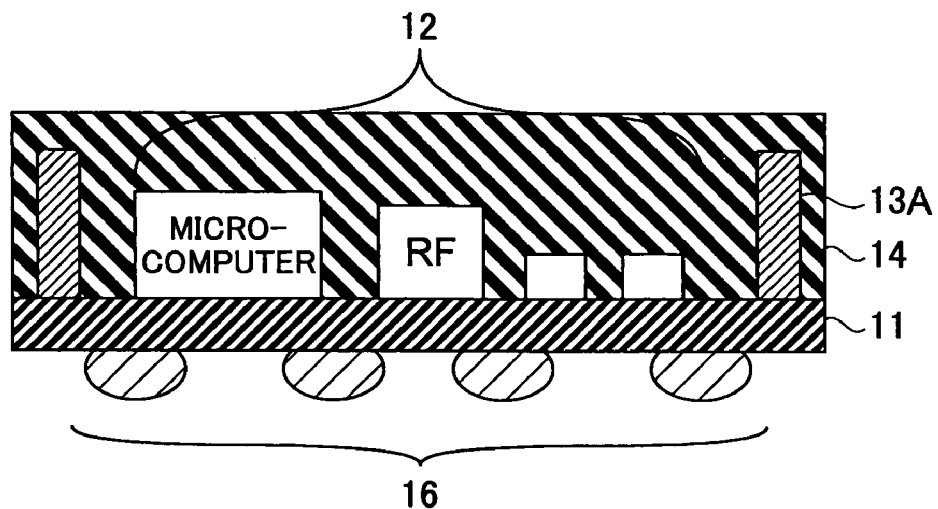
FIGS. 4A through 4C are views illustrating a manufacturing method of a reader/writer according to a second embodiment of the present invention.
Figure 4B:
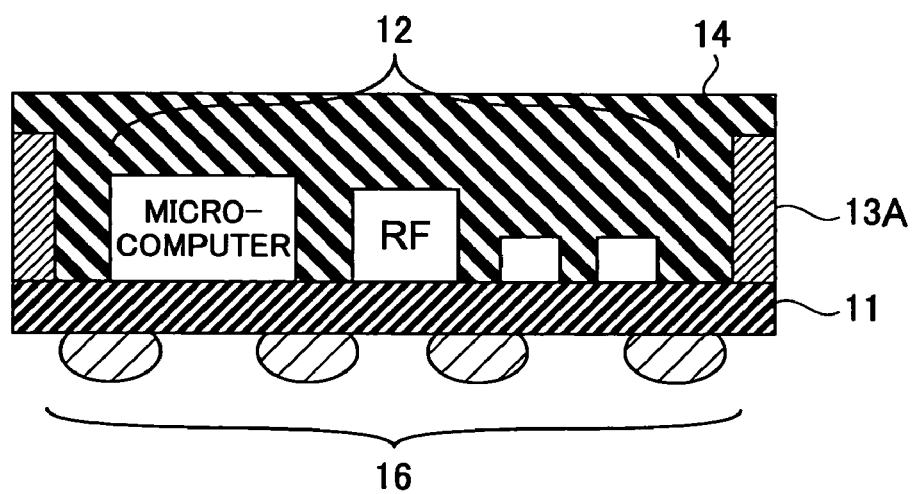
Figure 4C:
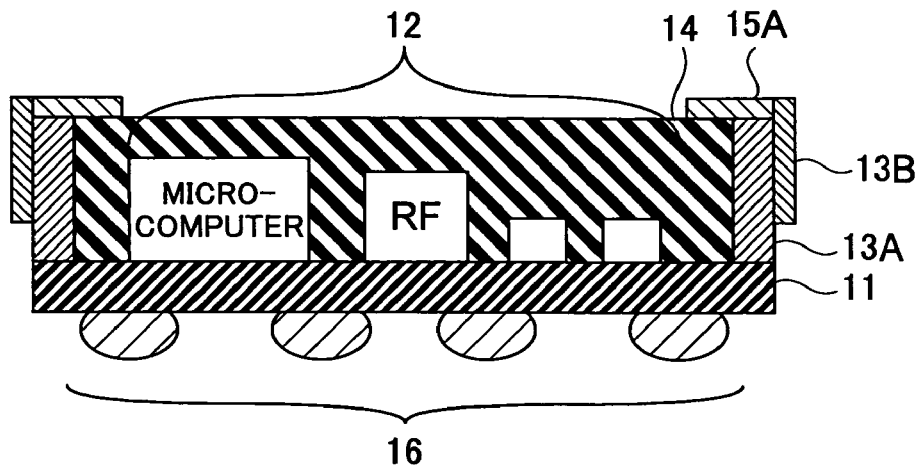

A method for connecting the antenna 15 and the antenna connecting post 13 is not limited to the above description, but various configurations can be adopted. For example, FIGS. 4A through 4C are views illustrating a method of manufacturing a reader/writer in turn according to a second embodiment of the present invention. It should be noted that the above described components are given the same reference numerals, and a description thereof is omitted. The components where descriptions are omitted are the same as the first embodiment.

First, the communication control part 12 is formed on the substrate 11 in the same way as the first embodiment as shown in FIGS. 3A and 3B. Then, the solder bumps 16 and the molded resin layer 14 are provided.

In the present embodiment, in the same way as the antenna connecting post 13 according to the first embodiment, an antenna connecting post 13A is provided on the substrate 11. As described below, a lateral surface of the molded resin layer 14 is ground so that the antenna connecting post 13A is exposed. Accordingly, it is desirable to form the antenna connecting post 13A thicker than the antenna connecting post 13 described above. In other words, it is desirable to form the antenna connecting post 13A having extra body to be ground.

Next, in the process shown in FIG. 4B, a lateral side of the molded resin layer 14, i.e., a side orthogonal to the side which is ground in the first embodiment is ground so as to expose a lateral side of the antenna connecting post 13A. In this case, the lateral side of the antenna connecting post 13A may also be ground.

Then, in the process shown in FIG. 4C, on the lateral side ground in the process shown in FIG. 4B, the antenna connecting wiring 13B is formed. In addition, an antenna 15A is provided in the same way as shown in the first embodiment on the upper surface of the molded resin layer 14 so that the antenna 15A is connected to the antenna connecting wiring 13B. It should be noted that an insulating layer may be made in the same way as the first embodiment on the molded resin layer 14 and the antenna 15A so as to cover the antenna 15A.

Accordingly, the antenna formed on the molded resin layer 14 can be connected to the communication control part 12 by various wirings structures.

Third Embodiment

Figure 5A:
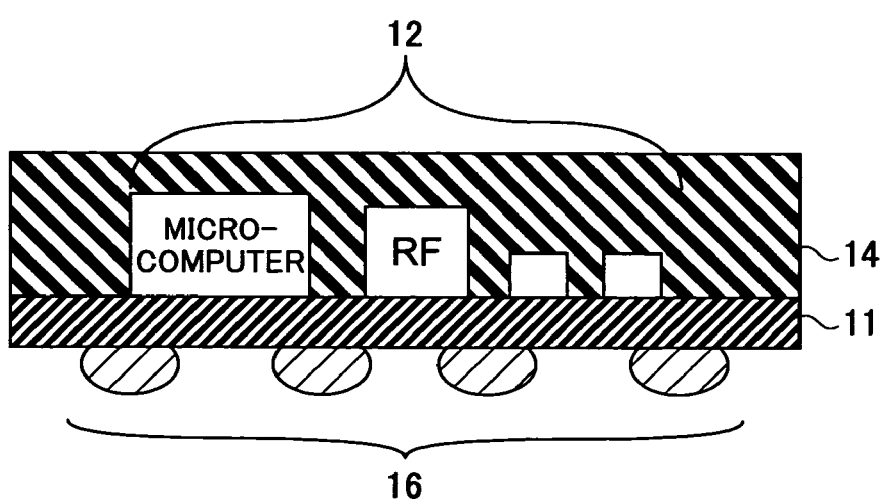
FIGS. 5A through 5C are views illustrating a manufacturing method of a reader/writer according to a third embodiment of the present invention.
Figure 5B:
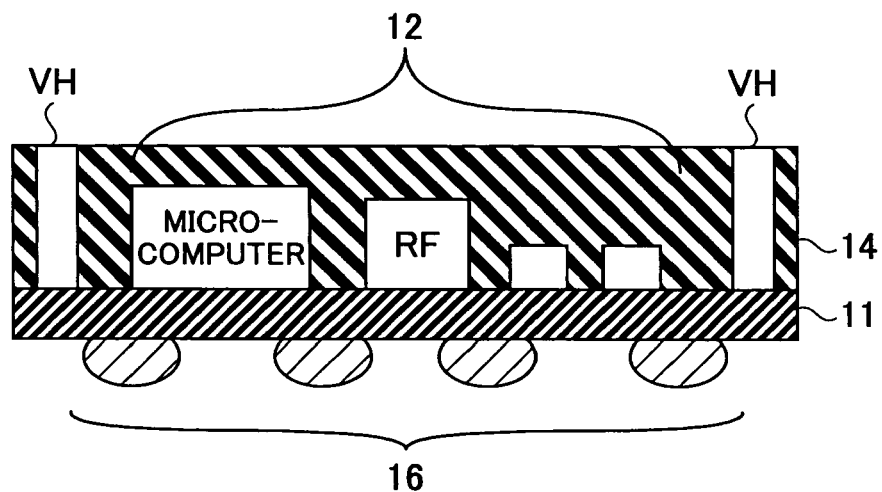
Figure 5C:
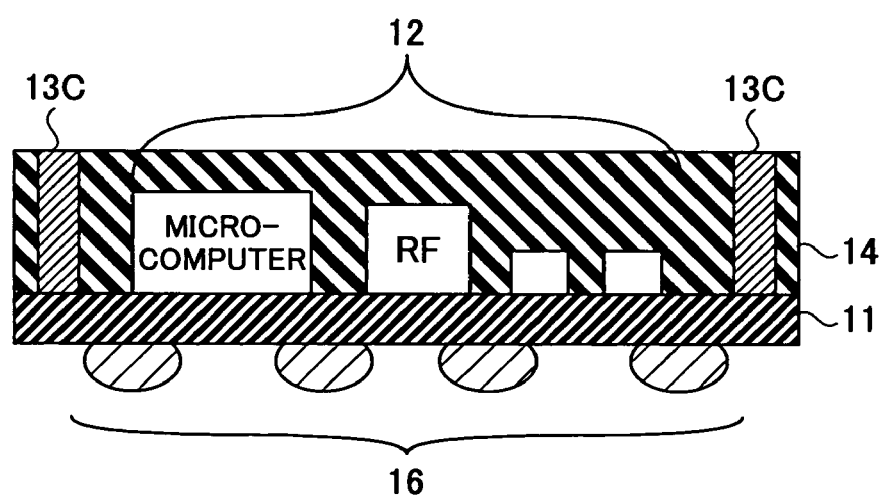

Further, it is possible to form an antenna connecting post for connecting an antenna and a communication control part by various ways. For example, the antenna connecting post may be formed as shown in FIGS. 5A through 5C. It should be noted that in FIGS. 5A through 5C, the components described above are given the same reference numerals, and a description thereof is omitted. Moreover, the components where a description is omitted are the same as the first embodiment.

First, in the same way as the first embodiment shown in FIGS. 3A and 3B, the communication control part 12 is provided on the substrate 11. Then, the solder bumps 16 and the molded resin layer 14 are provided.

According to the present embodiment, the antenna connecting post formed in the first embodiment is formed later in the process below.

Next, in the process shown in FIG. 5B, a via hole VH is formed by, for example, a laser, penetrating the molded resin layer 14.

Then, in the process shown in FIG. 5C, a conductive paste such as Cu is injected into the via hole VH so as to fill the via hole VH. In addition, an antenna connecting post 13C is formed according to Cu plating. The succeeding processes for completing the reader/writer are the same as the first embodiment shown in FIGS. 3D and 3E.

Accordingly, the antenna connecting post for connecting the antenna and the communication control part can be made by various methods and materials.

Fourth Embodiment

The antenna formed on the molded resin layer in the reader/writer described in the first through third embodiments can be formed according to various patterning as appropriate. Further, the antenna connecting post can be formed by the method described below.

Figure 6:
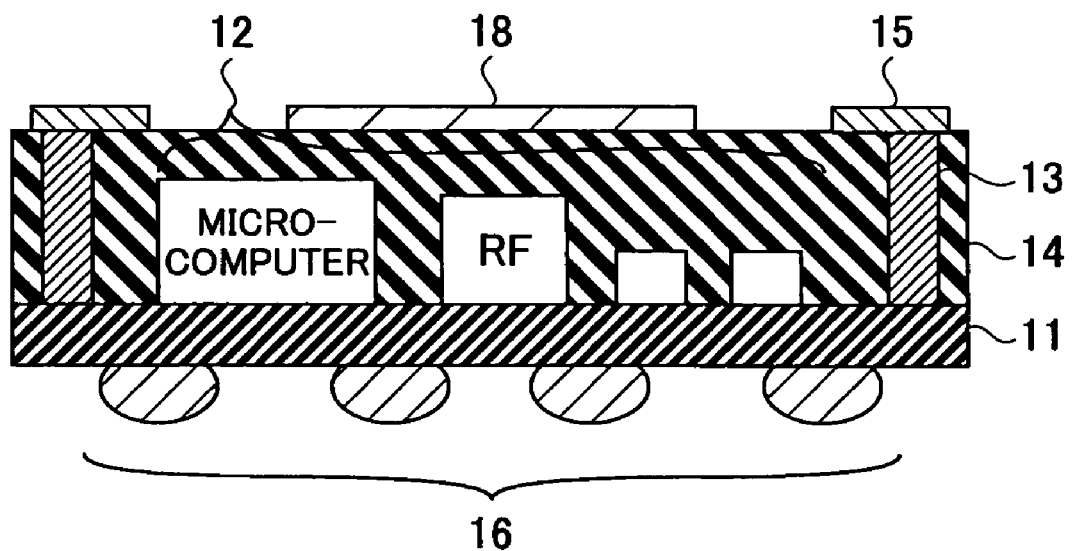
FIG. 6 is a cross-sectional pattern view illustrating a reader/writer according to a fourth embodiment of the present invention.

FIG. 6 is a cross-sectional pattern view of a reader/writer 10D according to a fourth embodiment of the present invention. It should be noted that the components described above are given the same reference numerals and a description thereof is omitted.

Referring to FIG. 6, in the reader/writer according to the present embodiment, a pattern shape 18 made from, for example, a magnetic member is formed on the molded resin layer 14. Accordingly, the magnetic member is provided at substantially a center of the antenna 15 patterned as a loop. In addition, the shape, thickness and the like of the magnetic member are controlled so as to change characteristics of the antenna 15. Moreover, for example, a multilayer interconnection structure may be built on the antenna across the insulating layer. Furthermore, another device may be provided on the multilayer interconnection structure so as to realize a multifunction communication device.

According to at least one of the embodiments of the present invention, the antenna connecting post is provided on the substrate, connecting the communication control part and the antenna. In addition, the antenna connecting post is configured to be connected to the antenna on the molded resin layer. Accordingly, the configuration can be simplified, in which configuration the antenna and the communication control part are connected.

According to at least one of the embodiments of the present invention, the connecting part for connecting the communication control part is provided on the surface of the substrate, reverse to the surface where the communication control part is provided. Accordingly, it is easy to connect the communication control part with an object for connecting.

According to at least one of the embodiments of the present invention, the connecting part and the antenna are formed so as to oppose with each other across the molded resin layer. Accordingly, the thickness of the reader/writer having the connecting part and the antenna can be reduced.

According to at least one of the embodiments of the present invention, a reader/writer is provided, enabling a size and thickness reduction and performing communications with an IC card.

Further, the present invention is not limited to these embodiments, but variations and modifications may be made without departing from the scope of the present invention.

The present application is based on Japanese Priority Application No. 2005-009467 filed on Jan. 17, 2005, with the Japanese Patent Office, the entire contents of which are hereby incorporated by reference.

What is claimed is:

1. A method of manufacturing a reader/writer comprising a substrate, a communication control part provided on the substrate, a molded resin layer for sealing the communication control part, and an antenna connected to the communication control part, said method comprising the steps of:

forming the communication control part and an antenna connecting post on the substrate, said antenna connecting post being provided for connecting the communication control part and the antenna;

injecting resin over the communication control part and the antenna connecting post to form the molded resin layer on the substrate, said molded resin layer covering the communication control part and the antenna connecting post;

grinding the molded resin layer so as to expose the antenna connecting post; and forming the antenna on the molded resin layer, said antenna being connected to the antenna connecting post which is exposed in the grinding step.

2. The method of manufacturing the reader/writer as claimed in claim 1, further comprising a step of forming an insulating layer so as to cover the antenna.

* * * * *